(12) United States Patent
Zeng et al.

(10) Patent No.: US 9,804,502 B2
(45) Date of Patent: Oct. 31, 2017

(54) ILLUMINATION DEVICE AND METHOD FOR USING THE SAME IN THE PROJECTION LITHOGRAPHY MACHINE

(71) Applicant: Shanghai Institute of Optics And Fine Mechanics, Chinese Academy of Sciences, Shanghai (CN)

(72) Inventors: Aijun Zeng, Shanghai (CN); Yunbo Zhang, Shanghai (CN); Mingxing Chen, Shanghai (CN); Ying Wang, Shanghai (CN); Huijie Huang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 51 days.

(21) Appl. No.: 14/985,086

(22) Filed: Dec. 30, 2015

(65) Prior Publication Data

US 2016/0109806 A1 Apr. 21, 2016

Related U.S. Application Data

(63) Continuation of application No. PCT/CN2013/001006, filed on Aug. 26, 2013.

(30) Foreign Application Priority Data

Jul. 19, 2013 (CN) .......................... 2013 1 0307405

(51) Int. Cl.
*G03B 27/54* (2006.01)
*G03F 7/20* (2006.01)
(Continued)

(52) U.S. Cl.
CPC ........... *G03F 7/702* (2013.01); *G02B 3/0006* (2013.01); *G02B 5/005* (2013.01);
(Continued)

(58) Field of Classification Search
CPC .. G03F 7/70075; G03F 7/70116; G03F 7/702; G03F 7/7025; G02B 26/0833; G02B 26/105; G02B 3/0006; G02B 5/005
(Continued)

(56) References Cited

U.S. PATENT DOCUMENTS 4,632,522 A 12/1986 Ishitani
7,187,430 B2 3/2007 Oskotsky et al.
(Continued)

FOREIGN PATENT DOCUMENTS

CN 1858650 A 11/2006
CN 101916047 A 12/2010

*Primary Examiner* — Peter B Kim
(74) *Attorney, Agent, or Firm* — Mei & Mark LLP; Manni Li

(57) ABSTRACT

An illumination device comprises a laser source, a beam expander, a micromirror array having a first control system, a fast steering mirror having a second control system, a diaphragm array, a microlens array, an illumination lens group, and a reflection mirror sequentially along the propagation direction of the laser beam. The first control system comprises a first computer controlling each micromirror on the micro-mirror array through the micromirror array controller to rotate in two-dimensional directions so expanded beam forms desired intensity patterns on the diaphragm array after reflected by the micromirror array and fast reflection mirror and a micromirror array controller; the second control system comprises a second computer controlling the reflection mirror of the fast steering mirror to rotate through fast steering mirror controller so created intensity pattern moves relative to the diaphragm array and a fast steering mirror controller. Method for using the illumination device is provided.

4 Claims, 3 Drawing Sheets

(51) Int. Cl.
 G02B 5/00 (2006.01)
 G02B 3/00 (2006.01)
 G02B 26/08 (2006.01)
 G02B 26/10 (2006.01)
(52) U.S. Cl.
 CPC ....... *G02B 26/0833* (2013.01); *G02B 26/105* (2013.01); *G03F 7/7025* (2013.01); *G03F 7/70075* (2013.01); *G03F 7/70116* (2013.01)
(58) Field of Classification Search
 USPC .......................................................... 355/67
 See application file for complete search history.

(56) References Cited

U.S. PATENT DOCUMENTS

| | | |
|---|---|---|
| 7,982,855 B2 | 7/2011 | Boutonne et al. |
| 2010/0060873 A1 | 3/2010 | Deguenther et al. |

ILLUMINATION DEVICE AND METHOD FOR USING THE SAME IN THE PROJECTION LITHOGRAPHY MACHINE

CROSS-REFERENCE TO RELATED APPLICATIONS

The subject application is a continuation of PCT/CN2013/001006 filed on Aug. 26, 2013, which claims priority on Chinese patent application 201310307405.5 filed on Jul. 19, 2013 in China. The contents and subject matter of the PCT and Chinese priority applications are incorporated herein by reference.

TECHNICAL FIELD

The present invention relates to a projection lithography machine, particularly, an illumination device and method for using the same in the projection lithography machine.

BACKGROUND OF THE INVENTION

Projection lithography machine is used for manufacturing large scale integrated circuit (LSI) and micro-electromechanical systems (MEMS). Projection lithography machine comprises an illumination system and a projection objective. The illumination system illuminates the mask with high uniformity, and a fine pattern on the mask is imaged onto photoresist on silicon wafer by the projection objective. The illumination system is mainly used for laser beam shaping, uniform illumination, changing the coherence factor, polarization control, and field control.

U.S. Pat. No. 7,187,430B2 discloses an illumination system which comprises a diffractive optical element, a zoom lens group, a conical lens group, a microlens array, a condenser lens group, a scanning slit, and an illumination lens group et al. The collimated beam is incident onto the diffractive optical element. The beam passes through the diffraction optical device, the zoom lens group, the conical mirror group and then forms a light intensity distribution on the microlens array surface (the light intensity distribution is called intensity mode in the projection lithography). The laser beam forms a rectangular spot with uniformity better than 99% by a microlens array and a condenser lens. The rectangular spot is projected on to the mask plane by the projection lens group. The scanning slit not only controls the size of the exposure field but also determines the intensity uniformity of exposure field. Therefore, the machining precision and speed precision of the scanning slit directly affect the performance of the projection lithography machine. Motion control components and dynamics analysis of the scanning slit are extremely complex, and it requires special isolation unit to avoid vibration from the scanning silt, which also increases the system complexity and cost.

U.S. Pat. No. 7,982,855B2 discloses an illuminator for microlithography device (i.e., an illumination system). The illuminator cuts angle spectrum to replace the existing slit scanning. The advantages are that it can not only reduce the scanning speed and scanning range but also eliminate the illumination lens group. However, it requires higher scanning speed and positional accuracy.

SUMMARY OF THE INVENTION

The present invention solves the problems by providing an illumination device and a method for using the same in the projection lithography machine based on fast scanning mirror. The illumination device of the present invention greatly simplifies the structure and improves the stability and energy utilization.

The illumination device for a projection lithographic machine of the present invention comprises a laser source, a beam expander, a micromirror array, a fast steering mirror, a diaphragm array, a microlens array, a two-dimensional rotation angle a illumination lens group, and a reflection mirror; the micromirror array has a first control system which comprises a first computer and the a micromirror array controller, the first computer controls the rotating angle of the micromirrors on the micromirror array through micromirror array controller; the fast steering mirror has a second control system, the second control system includes a second computer and a fast steering mirror controller, a second computer controls the rotatable mirror of fast steering mirror through the fast steering mirror controller; the diaphragm array is located in the front focal plane of the microlens array, the diaphragm array is in rectangular shape, comprising a plurality of identical small rectangular diaphragms, all the small diaphragms are arranged in two-dimension uniform distribution, all the long axes of the small diaphragms are parallel to each other, the small diaphragm's length is less than the space of the two adjacent small diaphragm along direction of the small diaphragm's length, the small diaphragm's width is less than the space of the two adjacent small diaphragm along direction of the small diaphragm's width. All the micromirrors on the micromirror array are in the same shape.

In the illumination device of the present invention, the area of the small diaphragm is as S time as large as the area of single micromirrors, and S is a positive integer.

In the illumination device of the present invention, the number of small diaphragm is 1000-50000; the number of micromirrors is larger than the number of small diaphragms.

The method of using the illumination device comprises the following steps:

① determine the intensity pattern which is one of traditional illumination mode, annular illumination mode, dipole-X illumination mode, dipole-Y illumination mode, quadrupole illumination mode;

② calculate two-dimensional rotation angles of each micromirror array base on the determined intensity pattern as following method: dividing the intensity pattern into the same square spots which have the same area as micromirror, the j-th rectangular spot center coordinate is (Xj, Yj), the center coordinates of the micromirrors corresponding to the j-th rectangular spot are $(X'_p, Y'_p)$, $(X'_{P+1}, Y'_{P+1})$, . . . , $(X'_{P+T-1}, Y'_{P+T-1})$, the optical distance between the micromirror array and diaphragm array is L, the two-dimensional rotation angle of each micromirror can be calculated as:

$$\alpha_p = \arctan[(X_j - X'_p)/L]/2, \beta_p = \arctan[(Y_j - Y'_p)/L]/2$$

$$\alpha_{p+1} = \arctan[(X_j - X'_{P+1})/L]/2, \beta_{p+1} = \arctan[(Y_j - Y'_{P+1})/L]/2$$

$$\ldots$$

$$\alpha_{p+T-1} = \arctan[(X_j - X'_{P+T-1})/L]/2,$$
$$\beta_{p+T-1} = \arctan[(Y_j - Y'_{P+T-1})/L]/2;$$

③ The two-dimensional rotation angle step obtained by step ② is input to the first computer, the first computer controls the rotation angle of each micromirror through the micromirror array controller in order to get desired intensity patterns on diaphragm array;

④ Calculate the initial angle δo and angular velocity ω according to the initial position and the moving speed using following method: suppose that the initial position of the mask is (X", Y"), the mask steering speed is V, the focal length of the microlens array is $f_1$, the focal length of the condenser lens group is $f_2$, the optical distance of the light beam from the fast steering mirror to diaphragm array along the optical axis is D, the initial angle and the angular velocity can be expressed as:

$$\delta_0 = \arctan(Y'' * f_1 * f_2 / D),$$

$$\omega = \arctan(V * f_1 / f_2 / D);$$

⑤ input initial rotation angle $\delta_0$ into the second computer to control the fast steering mirror rotate to the angle of $\delta_0$;

⑥ t time after the start of scanning, the angle of ($\delta_0 + \omega t$) is input to the second computer, and the second computer controls the fast steering mirror to rotate to the angle of ($\delta_0 + \omega t$) through fast steering mirror controller. Therefore, the intensity pattern formed by step ③ moves with respect to the diaphragm array. The scanning time will last $d_2/V/f_1*f_2$.

Compared with the current technology, the present invention provides the following advantages:

1. Instead of the zoom lens group, conical lens group, and scanning slit, the micromirror array is used to reduce the cost and complexity of the traditional system;

2. the present invention uses fast scanning mirror and fixed diaphragm array instead of scanning slit, so it reduces the effects of mechanical vibration on the illumination system optics and improves the stability of the system;

3. Since the zoom lens group, the conical lens group, and illumination lens group are not used, energy efficiency is improved.

DETAILED DESCRIPTION OF THE INVENTION AND EMBODIMENTS

The present invention is further illustrated by the embodiments below and attached figures, but the scope of the present invention should not be limited to the embodiments and figures.

Figure 1:
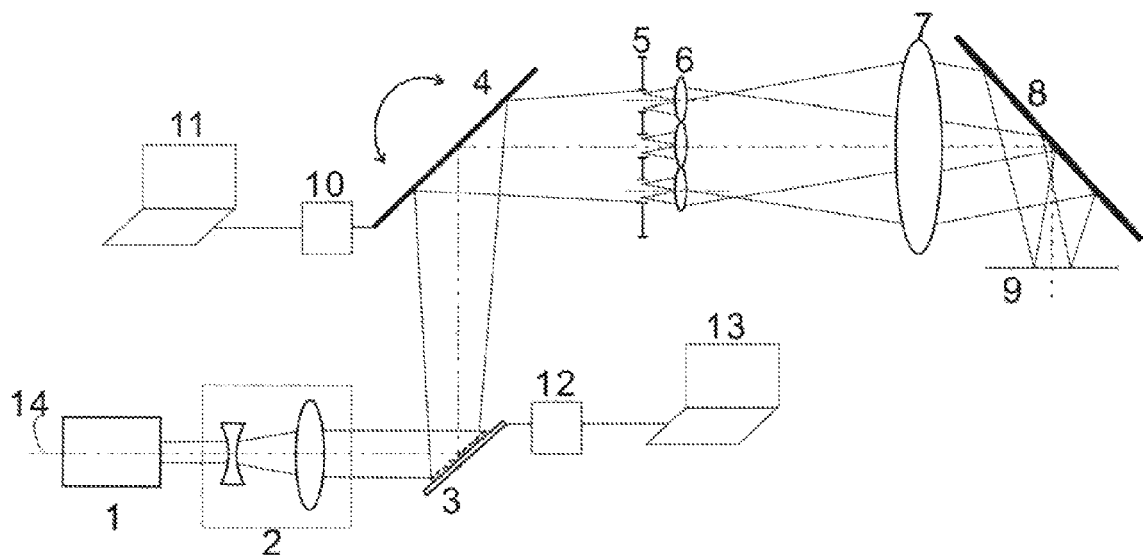
FIG. 1 shows an embodiment of the illumination device of the present invention.

As shown in FIG. 1, in one embodiment of the present invention, the illumination device for a projection lithography machine includes a laser source 1, a beam expander 2, a micromirror array 3, a fast steering mirror 4, a diaphragm array 5, a microlens array 6, a illumination lens group 7, and a reflection mirror 8. The micromirror array 3 has a first control system which comprises a first computer 13 and a micromirror array controller 12. The first computer 13 controls the rotating angle of the micromirrors on the micromirror array 3 through micromirror array controller 12. The fast steering mirror 4 has a second control system. The second control system includes a second computer 11 and a fast steering mirror controller 10; the second computer 11 controls the rotatable mirror of fast steering mirror through the fast steering mirror controller 10. The diaphragm array 5 is located in the front focal plane of the microlens array 6. The diaphragm array 5 is in the rectangular shape and comprises a plurality of identical small rectangular diaphragms 5-2. All the small diaphragms 5-2 are arranged in two-dimension uniform distribution; all the long axes of the small diaphragms 5-2 are parallel to each other; the length of the small diaphragm 5-2 is less than the space between the two adjacent small diaphragm 5-2 along direction of the length of the small diaphragm 5-2; the width of the small diaphragm 5-2 is less than the space between the two adjacent small diaphragm 5-2 along direction of the width of the small diaphragm 5-2. All the micromirrors on the micromirror array 3 are in the same shape.

In the present invention, the micromirror array 3 is an MEMS product comprising tens of thousands micromirror units. The first computer 13 controls the micromirror on the array micromirror array 3 through the controller 12 in order to form desired intensity patterns on the diaphragm array 5. The micromirror array 3 has 40000 (200×200) micromirror units, the side length of each micromirror unit is 200 μm, and the working wavelength is 193 nm-800 nm. The fast scanning mirror 4 is a component that uses piezoelectric drive voice coil motor to drive portion of the rotating mirror and deflect the beam to change the propagation direction, the diameter of reflection mirror portion is greater than 50 mm, the rotation angle accuracy is better than 0.1 μrad.

Laser source 1 radiates a DUV laser beam with a stable frequency. Normally, the beam expander 2 is needed to expand beam because the cross-section of the output laser beam is small. The expanded laser beam is incident onto the micromirror array 3. The first computer 13 controls the voltage applied to the micromirrors on the micromirror array 3 through the micromirror array controller 12, so that the beam forms desired intensity patterns on diaphragm array 5 after passing through micromirror array 3, fast steering mirror 4. Part of formed Intensity pattern passing through the diaphragm array 5 illuminates the mask 9 after passing though the microlens array 6, the condenser lens group 7 and the mirror 8. The second computer 11 controls the rotatable mirror of fast steering mirror 4 through the fast steering mirror controller 10, so that the formed intensity pattern moves relatively to diaphragm array 5. The distance L of beam propagation along the optical axis 14 from the micromirror array to diaphragm array 5 is much larger than the size of the work area on the micromirror array, in the embodiment, L≥1000 mm, the distance D along the optical axis from the fast steering mirror to the diaphragm array 5 satisfies D≥L/2.

Figure 2:
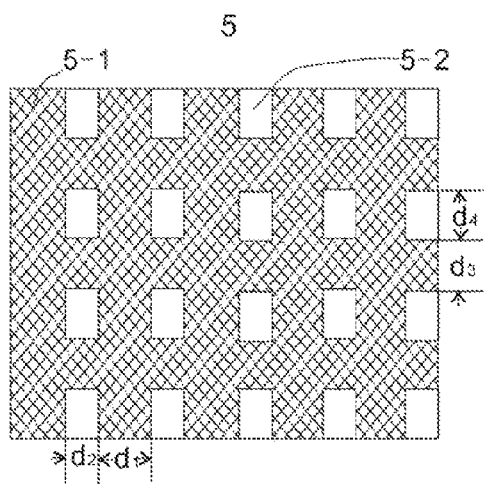
FIG. 2 shows an embodiment of the diaphragm array in the illumination device of the present invention.

As shown in FIG. 2, in one embodiment of the present invention, the diaphragm array 5 has a dimension of 120 mm×120 mm and a thickness of 5 mm including a light blocking section 5-1 and multiple rectangular small diaphragms 5-2. The size of each small diaphragm is 0.4 mm×0.2 mm, the number of small diaphragms is 10,000, and all the small diaphragms are uniformly distributed on the diaphragm array 5. The relationship between the size of the small diaphragm 5-2 and the relative position between adjacent small diaphragms satisfies $d_1=1.2\ d_2$, $d_3=1.2\ d_4$.

The method of using the illumination device of the present invention comprises the following steps:

① determine the intensity pattern which is one of traditional illumination mode, annular illumination mode, dipole-X illumination mode, dipole-Y illumination mode, quadrupole illumination mode;

② calculate two-dimensional rotation angles of each micromirror array 3 base on the determined intensity pattern;

③ the two-dimensional rotation angle step obtained by step ② is input to the first computer 13, the first computer 13 controls the rotation angle of each micromirror through the micromirror array controller 3 in order to get desired intensity patterns on diaphragm array 5;

④ calculate the initial angle $\delta_0$ and angular velocity $\omega$ of the fast steering mirror 4 according to the initial position and the moving speed;

⑤ input initial rotation angle $\delta_0$ into the second computer 11 to control the fast steering mirror 4 to rotate to the angle of $\delta_0$;

⑥ t time after the start of scanning, the angle of $(\delta_0+\omega t)$ is input to the second computer 11, and the second computer 11 controls the fast steering mirror 4 to rotate to the angle of $(\delta_0+\omega t)$ through fast steering mirror controller 10. Therefore, the intensity pattern formed by step ③ moves with respect to the diaphragm array 5. The scanning time will last $d_2/V/f_1*f_2$.

Figure 3:
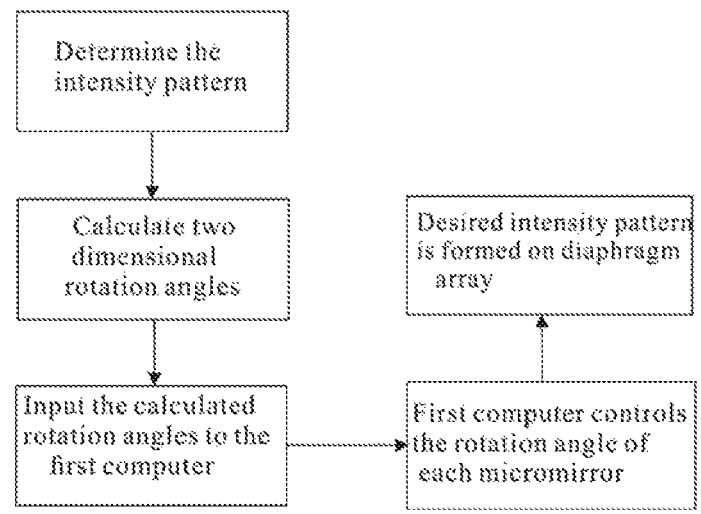
FIG. 3 is a flow chart showing a control program of the first computer in the illumination device of the present invention.
Figure 4:
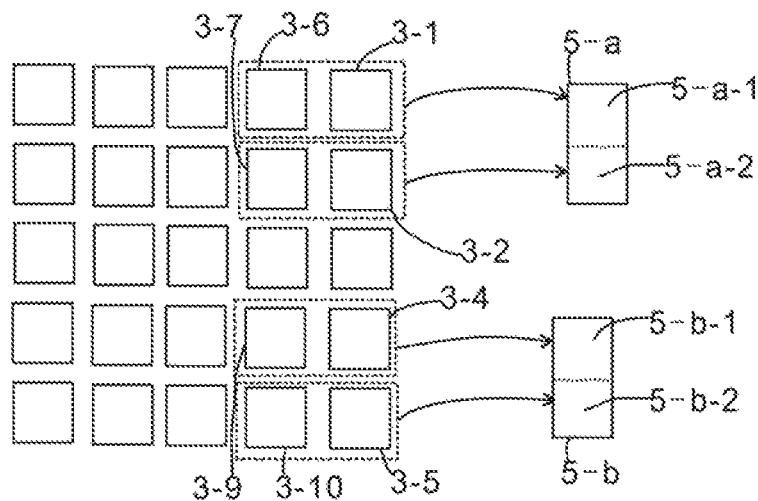
FIG. 4 shows the relationship of micromirror and the illumination device in the present invention.

FIG. 3 is a flow chart showing the control programs of first computer 13 in the method of the present invention. Firstly, the intensity pattern on the diaphragm array 5 is confirmed. The intensity pattern contains numbers of white rectangular spots 5-a as shown in FIG. 4. The size of white rectangular spots 5-a is the same as small diaphragm 5-2 on the diaphragm array 5. The number of white rectangular beam 5-a, N, is less than 50000. As the area of white rectangular beam 5-a is two times as large as that of one micromirror, the area of white rectangular beam 5-a corresponds to the area of the two mirror units. It must also be satisfied that S=(40000/2N), and S is a positive integer. In one embodiment of the present invention, N is 8000, and S is 2.

The two dimensional rotation angles of micromirror may be calculated as follows: first, each of white rectangular spot is split into two squares which side length is 0.2 mm, the center of each square spot coordinates is $(X_j, Y_j)$, wherein $1 \le j \le 8000$. The coordinates of the two micromirrors corresponding to the j-th square spot are $(X'_p, Y'_p)$, $(X'_q, Y'_q)$, where $1 \le p \le 8000$, $1 \le q \le 8000$. These rotation angle of these two micromirrors are $(\alpha_p=\arctan[(X_j-X'_p)/L]/2$, $\beta_p=\arctan[(Y_j-Y'_p)/L]/2)$, $(\alpha_q=\arctan[(X_j-X'_q)/L]/2$, $\beta_q=\arctan[(Y_j-Y'_q)/L]/2)$. Then, all the calculated rotation angles are input into the the first computer control program; the first computer 13 controls each micromirror of the micromirror array 3 in order to get desired intensity pattern on the diaphragm array 5. The micromirrors keep these rotation angle still for one intensity pattern until the end of the scanning process.

FIG. 4 shows one alternative corresponding relationship between the micromirrors and the intensity pattern. White rectangular spot 5-a may be divided into two square spots, 5-a-1 and 5-a-2. Square spot 5-a-1 is corresponding to micromirror 3-1 and micromirror 3-6; square spot 5-a-2 is corresponding to micromirror 3-2 and micromirror 3-7. White rectangular spot 5-b may be divided into two square spots, 5-b-1 and 5-b-2. Square spot 5-b-1 is corresponding to micromirror 3-4 and micromirror 3-9; square spot 5-b-2 is corresponding to micromirror 3-5 and micromirror 3-10. The correspondence relationship between the micromirrors and the intensity pattern is not unique, and it is optimal when the micromirror rotation angle is small.

Figure 5:
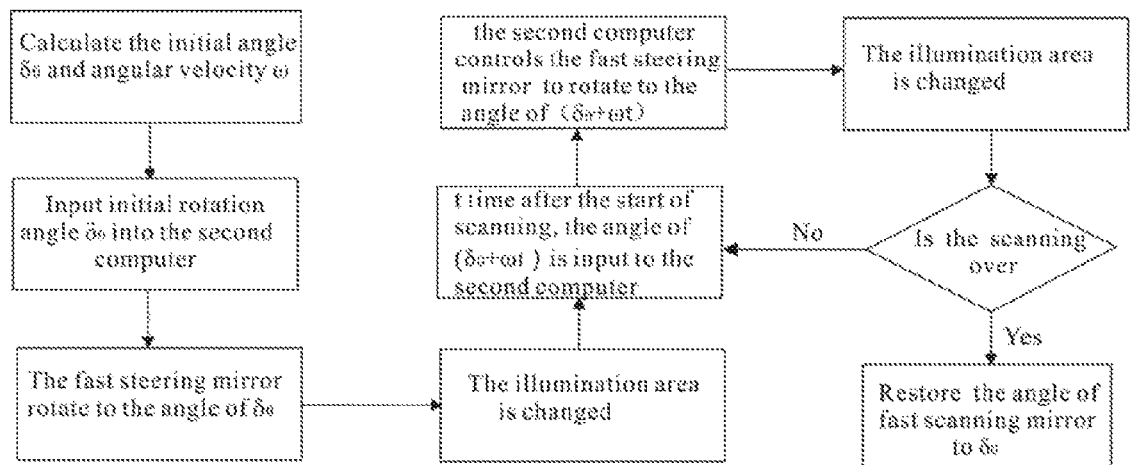
FIG. 5 is a flowchart showing a control program of the second computer in the illumination device of the present invention.

As shown in FIG. 5, a flowchart of the second computer control program 11 in the present invention, firstly, calculate the initial angle $\delta o$ and angular velocity $\omega$ according to the mask initial position and the scanning speed, and then input initial rotation angle $\delta_0$ into the second computer 11 to control the fast steering mirror 4 rotate to the angle of $\delta_0$. t time after the start of scanning, the angle of $(\delta_0+\omega t)$ is input to the second computer 11, and the second computer controls the fast steering mirror 4 to rotate to the angle of $(\delta_0+\omega t)$ through fast steering mirror controller 10. Part of formed Intensity pattern passing through diaphragm array 5 illuminates the mask 9 after passing though microlens array 6, the condenser lens group 7, and the mirror 8. The second computer 11 controls the rotatable mirror of fast steering mirror 4 through the fast steering mirror controller 10, so that the formed intensity pattern moves relatively to diaphragm array 5. Suppose that the initial position of the mask is (X", Y"), the mask steering speed is V, the focal length of the microlens array is $f_1$, the focal length of the condenser lens group is $f_2$, the optical distance of the light beam from the fast steering mirror to diaphragm array the spread of the array along the distance along the optical axis is D, the initial angle and the angular velocity may be expressed as $\delta_0=\text{axc tan}(Y"*f/f2/D)$, $\omega=\arctan(V*f_1/f_2/D)$.

As seen above, firstly, the first computer 12 controls micromirror array 3 through micromirror array controller 13 to form desired intensity pattern on diaphragm array 5, and then the second computer 11 controls the fast steering mirror 4 through fast steering mirror controller 10 to move the formed intensity pattern relatively to diaphragm array 5. The use of the fast steering mirror 4 and diaphragm array 5 greatly differs from the projection aligner illumination device described in the current technology.

We claim:

1. An illumination device for a projection lithographic machine, comprising
   a laser source,
   a beam expander,
   a micromirror array,
   a fast steering mirror,
   a diaphragm array,
   a microlens array,
   an illumination lens group, and
   a reflection mirror,
   wherein the micromirror array has a first control system and micromirrors; the first control system comprises a first computer and a micromirror array controller; the first computer controls a rotating angle of the micromirrors on the micromirror array through the micromirror array controller;
   the fast steering mirror has a second control system; the second control system comprises a second computer and a fast steering mirror controller; the second computer controls a rotatable mirror of the fast steering mirror through the fast steering mirror controller;
   the diaphragm array is located in a front focal plane of the microlens array, the diaphragm array is in rectangular shape and comprises a plurality of identical small rectangular diaphragms; all the small rectangular diaphragms are arranged in two-dimension uniform distribution, all long axes of the small rectangular diaphragms are parallel to each other, the length of the small diaphragm is less than a space between the two adjacent small diaphragms along a direction of the length of the small diaphragms; the width of the small diaphragm width is less than a space between the two adjacent small diaphragms along a direction of the width of the small diaphragms; and all the micromirrors on the micromirror array are in the same shape.

2. The illumination device according to claim 1, wherein an area of the small diaphragm is S times as large as an area of single micromirrors on the micromirror array, and S is a positive integer.

3. The illumination device according to claim 1, wherein a number of the small diaphragms on the diaphragm array is 1000-50000, a number of micromirrors on the micromirror array is larger than the number of the small diaphragms on the diaphragm array.

4. A method for using the illumination device of claim 1, comprising determining an intensity pattern on the diaphragm array to be one of a traditional illumination mode, an annular illumination mode, a dipole-X illumination mode, a dipole-Y illumination mode, or a quadrupole illumination mode, calculating two-dimensional rotation angles of each micromirror array based on the determined intensity pattern by dividing the intensity pattern into same square spots which have same area as the micromirror, a j-th rectangular spot center coordinate is (Xj, Yj), center coordinates of the micromirrors corresponding to the j-th rectangular spot are $(X'_p, Y'_p)$, $(X'_{P+1}, Y'_{P+1})$, ..., $(X'_{P+T-1}, Y'_{P+T-1})$, an optical distance between the micromirror array and the diaphragm array is L, the two-dimensional rotation angles of each micromirror is calculated by $$\alpha_p = \arctan[(X_j - X'_p)/L]/2, \beta_p = \arctan[(Y_j - Y'_p)/L]/2$$

$$\alpha_{p+1} = \arctan[(X_j - X'_{P+1})/L]/2, \beta_{p+1} = \arctan[(Y_j - Y'_{P+1})/L]/2$$

...

$$\alpha_{p+T-1} = \arctan[(X_j - X'_{P+T-1})/L]/2,$$
$$\beta_{p+T-1} = \arctan[(Y_j - Y'_{P+T-1})/L]/2;$$

inputting the two dimensional rotate angles into the first computer, the first computer controls a rotation angle of each micromirror through the micromirror array controller to get intensity patterns on the diaphragm array after a light beam passes through the micromirror array;

calculating an initial angle $\delta_0$ and an angular velocity $\omega$ of the fast steering mirror according to an initial position and moving speed by supposing that an initial position of a mask is (X", Y"), a steering speed of the mask is V, a focal length of the microlens array is $f_1$, a focal length of the illumination lens group is $f_2$, an optical distance of the light beam from the fast steering mirror to the diaphragm array along the optical axis is D, an initial angle and an angular velocity are expressed as $\delta_0 = \arctan(Y''*f_1/f_2/D)$ and $\omega = \arctan(V*f_1/f_2/D)$, inputting an initial rotation angle $\delta_0$ of the fast steering mirror into the second computer, the second computer controls the fast steering mirror to rotate to the angle of $\delta_0$, and t time after start scanning, angle $(\delta_0 + \omega t)$ is input to the second computer, and the second computer controls the fast steering mirror to rotate to angle $(\delta_0 + \omega t)$ through the fast steering mirror controller to make the intensity pattern moves with respect to the diaphragm array, and scanning time lasts $d_2/V/f_1*f_2$.

* * * * *